(12) United States Patent
Watanabe

(10) Patent No.: US 11,367,712 B2
(45) Date of Patent: Jun. 21, 2022

(54) SEMICONDUCTOR DEVICE AND MANUFACTURING METHOD THEREOF

(71) Applicant: Kioxia Corporation, Tokyo (JP)

(72) Inventor: Takashi Watanabe, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/120,514

(22) Filed: Dec. 14, 2020

(65) Prior Publication Data

US 2021/0280561 A1 Sep. 9, 2021

(30) Foreign Application Priority Data

Mar. 9, 2020 (JP) .............................. JP2020-040202

(51) Int. Cl.
| | | |
|---|---|---|
| *H01L 25/065* | (2006.01) | |
| *H01L 23/00* | (2006.01) | |
| *H01L 23/544* | (2006.01) | |
| *H01L 25/00* | (2006.01) | |

(52) U.S. Cl.
CPC ........ *H01L 25/0657* (2013.01); *H01L 23/544* (2013.01); *H01L 24/08* (2013.01); *H01L 24/80* (2013.01); *H01L 25/50* (2013.01); *H01L 2223/54426* (2013.01); *H01L 2224/0217* (2013.01); *H01L 2224/08145* (2013.01); *H01L 2224/8013* (2013.01); *H01L 2224/80895* (2013.01); *H01L 2224/80896* (2013.01); *H01L 2225/06593* (2013.01)

(58) Field of Classification Search
CPC ... H01L 25/0657; H01L 23/544; H01L 24/08; H01L 24/80; H01L 25/50; H01L 2223/54426; H01L 2224/08145; H01L 2224/0813; H01L 2224/80895; H01L 2224/80896; H01L 2225/06513; H01L 2225/06565

See application file for complete search history.

(56) References Cited

U.S. PATENT DOCUMENTS

| | | |
|---|---|---|
| 7,618,847 B2 | 11/2009 | Tenmei et al. |
| 2019/0385984 A1 | 12/2019 | Koyanagi |
| 2021/0104482 A1* | 4/2021 | Hong ...................... H01L 24/13 |

FOREIGN PATENT DOCUMENTS

| | | |
|---|---|---|
| JP | 2009-49051 A | 3/2009 |
| JP | 2018-156968 A | 10/2018 |
| JP | 2019-184719 A | 10/2019 |

* cited by examiner

*Primary Examiner* — Thanh Y. Tran
(74) *Attorney, Agent, or Firm* — Oblon, McClelland, Maier & Neustadt, L.L.P.

(57) ABSTRACT

A semiconductor device according to the present embodiment includes a first chip and a second chip. A first pad is disposed so as to be exposed from a first region on a first surface. A first mark is provided by a first pattern and is disposed so as to be exposed from a second region. The second chip includes a second substrate, a second wire, a second pad, and a second mark. The second wire is disposed on the second substrate. The second pad is disposed so as to be exposed from a third region on a second surface, and is electrically connected to the second wire and the first pad. The second mark is provided by a second pattern corresponding to the first pattern, is disposed so as to be exposed from a fourth region, and has a thinner thickness than the second pad.

15 Claims, 16 Drawing Sheets

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2020-040202, filed on Mar. 9, 2020, the entire contents of which are incorporated herein by reference.

FIELD

The embodiments of the present invention relate to a semiconductor device and a manufacturing method thereof.

BACKGROUND

A hybrid bonding technology of bonding two wafers each having a semiconductor element formed thereon has been recently introduced into CMOS (Complementary Metal Oxide Semiconductor) image sensors and nonvolatile semiconductor memories. For example, in order to adjust a bonding position between two wafers, marks are formed on bonding surfaces.

However, in some cases it may be difficult to improve the alignment accuracy because it is difficult to accurately detect the marks in an inspection step during bonding.

DETAILED DESCRIPTION

Figure 1:
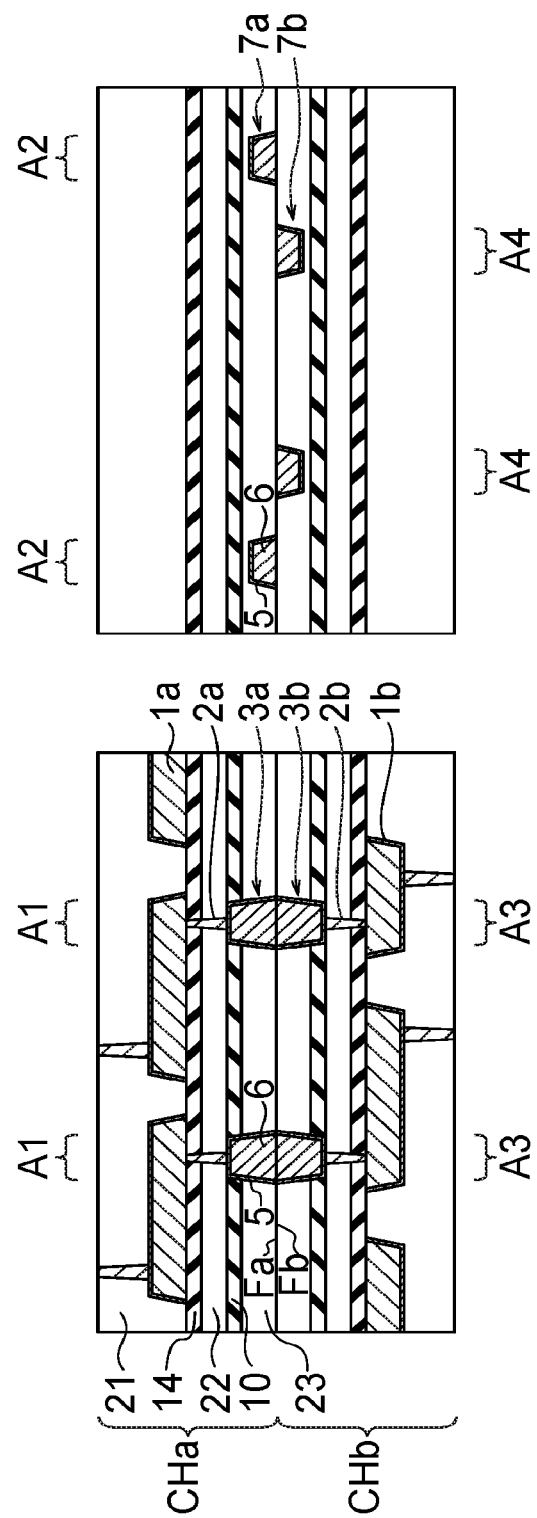
FIG. 1 is a cross-sectional view of a configuration of a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment incudes a first chip and a second chip. The second chip has a second surface which is opposed to the first surface of the first chip and on which the second chip is bonded to the first chip. The first chip includes a first substrate, a first wire, a first pad, and a first mark. The first wire is disposed on the first substrate. The first pad is disposed so as to be exposed from a first region on the first surface, and is electrically connected to the first wire. The first mark is provided by a first pattern and is disposed so as to be exposed from a second region different from the first region. The second chip includes a second substrate, a second wire, a second pad, and a second mark. The second wire is disposed on the second substrate. The second pad is disposed so as to be exposed from a third region on the second surface, and is electrically connected to the second wire and the first pad. The second mark is provided by a second pattern corresponding to the first pattern, is disposed so as to be exposed from a fourth region different from the third region, and has a thinner thickness than the second pad.

First Embodiment

FIG. 1 is a cross-sectional view of a configuration of a semiconductor device according to a first embodiment. The left side of FIG. 1 and the right side of FIG. 1 are cross-sectional views in different positions of the same chip. That is, the height (vertical) direction in the right side of FIG. 1 is the same as that in the left side of FIG. 1.

The semiconductor device includes a chip CHa and a chip CHb.

The chip CHa includes a semiconductor substrate, a wire 1a, a contact via 2a, a connection pad 3a, and a mark 7a. In the following explanation, a surface, of the semiconductor substrate, on which an inner circuit including wires is disposed is regarded as an upper surface.

The semiconductor substrate, which is not illustrated in FIG. 1, is disposed below (above on a sheet showing FIG. 1) the wire 1a. In addition, a stopper film 10, a barrier film 14, and insulating films 21, 22, 23 are disposed above the semiconductor substrate. For example, a silicon nitride film is used as the stopper film 10. For example, silicon oxide films are used as the insulating films 21, 22, 23.

The wire 1a is disposed on the semiconductor substrate. For example, a conductive material such as copper or tungsten is used for the wire 1a. The barrier film 14 is disposed above the wire 1a. A diffusion suppressing film (barrier metal 5) is disposed in the surrounding area of the wire 1a excluding a portion above the wire 1a. For example, the barrier metal 5 is a titanium (Ti) or tantalum nitride film (TaN).

The contact via 2a connects the wire 1a and the connection pad 3a to each other. That is, the wire 1a and the connection pad 3a are electrically connected via the contact via 2a. For example, a conductive material such as tungsten is used for the contact via 2a.

The connection pad 3a is disposed so as to be exposed from a connection pad region A1 on a surface Fa of the chip CHa. The connection pad 3a is electrically connected to the wire 1a. The barrier metal 5 is disposed in the surrounding area of the connection pad 3a excluding a portion above the connection pad 3a. A wiring metal 6 is embedded in the connection pad 3a. For example, a conductive material such as a copper (Cu) film is used for the wiring metal 6. The contact via 2a is disposed to cause a current flow between the layers in the chip. In contrast, the connection pad 3a is disposed to cause a current flow between the chips CHa and CHb.

The mark 7a is provided by a pattern Pa and is disposed so as to be exposed from a mark region A2 different from the connection pad region A1. The mark 7a serves as an alignment mark for aligning wafers, for example. The mark 7a is disposed in a space (mark region A2) among wires, elements, circuits, or the like. The mark 7a may be disposed on a wafer cutting schedule line (scribe line), for example. Further, the barrier metal 5 is disposed in the surrounding area of the mark 7a excluding a portion above the mark 7a. The wiring metal 6 is embedded in the mark 7a. In addition, the same material for the connection pad 3a may be used for the mark 7a. The details of the pattern Pa will be explained later with reference to FIG. 2.

The chip CHb is bonded, at a surface Fb which is opposed to the surface Fa of the chip CHa, to the chip CHa. Further, the chip CHb includes a semiconductor substrate, a wire 1b, a contact via 2b, a connection pad 3b, and a mark 7b.

The semiconductor substrate, which is not illustrated in FIG. 1, is disposed below the wire 1b. The same material for the semiconductor substrate of the chip CHa may be used for the semiconductor substrate of the chip CHb.

The wire 1b is disposed on the semiconductor substrate. The same material for the wire 1a may be used for the wire 1b.

The contact via 2b connects the wire 1b and the connection pad 3b to each other. That is, the wire 1b and the connection pad 3b are electrically connected via the contact via 2b. The same material for the contact via 2a may be used for the contact via 2b.

The connection pad 3b is disposed so as to be exposed from a connection pad region A3 on the surface Fb of the chip CHb. Further, the connection pad 3b is electrically connected to the wire 1b and the connection pad 3a. In addition, when the chip CHa and the chip CHb are bonded together, the connection pad 3b is connected to the connection pad 3a. The same material for the connection pad 3a may be used for the connection pad 3b.

The mark 7b is provided by a pattern Pb corresponding to the pattern Pa and is disposed so as to be exposed from a mark region A4 different from the connection pad region A3. The mark 7b serves as an alignment mark for aligning wafers, for example. The mark 7b is disposed in a space (mark region A4) among wires, elements, circuits, or the like. The mark 7b may be disposed on a wafer cutting schedule line (scribe line), for example. Further, the barrier metal 5 is disposed in the surrounding area of the mark 7b excluding a portion above the mark 7b. The wiring metal 6 is embedded in the mark 7b. The same material for the connection pad 3b may be used for the mark 7b. The mark 7b and the mark 7a are used for alignment of two bonded wafers, as explained later.

Figure 2:
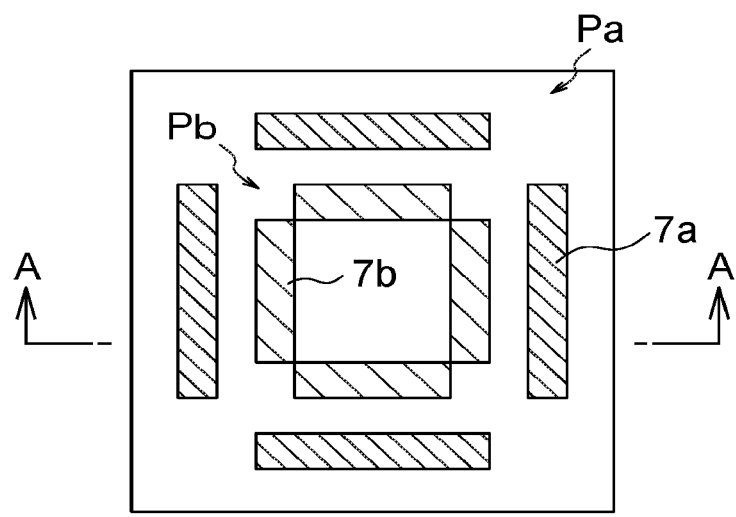
FIG. 2 is a schematic diagram illustrating marks according to the first embodiment.

FIG. 2 is a schematic diagram illustrating the marks 7a, 7b according to the first embodiment. FIG. 2 is a plan view of the chips CHa, CHb illustrated in FIG. 1, when viewed from above or below, for example. A cross-section taken along line A-A in FIG. 2 corresponds to the right side of FIG. 1.

The pattern Pa has a substantially square shape the sides of which are four substantially rectangular marks 7a. The pattern Pb has a substantially square shape the sides of which are four substantially rectangular marks 7b. The pattern Pb is disposed inside the pattern Pa. Determination as to whether or not the pattern Pa and the pattern Pb are located at respective regular positions is made, for example, whereby alignment is performed. The patterns of the marks 7a, 7b are not limited to the patterns Pa and Pb, and any patterns may be adopted as long as alignment of wafers can be performed.

As illustrated in FIG. 1, the mark 7b has a smaller distance (thickness) from the surface Fb than the connection pad 3b. The thickness of the connection pad 3b is approximately 500 nm, for example, and the thickness of the mark 7b is approximately 400 nm, for example, as explained later. In the embodiment illustrated in FIG. 1, the mark 7a also has a smaller thickness than the connection pad 3a. Hereinafter, a distance to an end farthest from the surface Fa/surface Fb may be simply referred to as "thickness".

Figure 3:
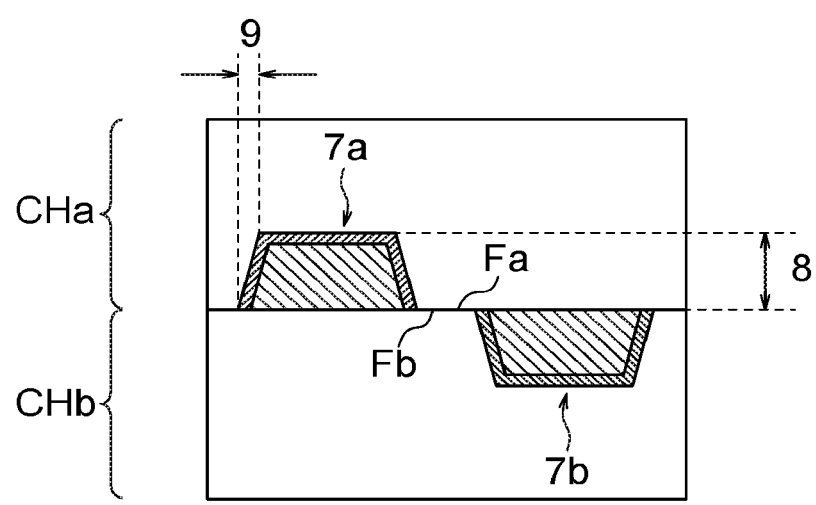
FIG. 3 is an enlarged cross-sectional view of marks in FIG. 1.

FIG. 3 is an enlarged cross-sectional view in which the marks 7a, 7b in FIG. 1 are enlarged. A height difference 8 represents a height difference between the mark 7a and the mark 7b, when the chips CHa, CHb are viewed from above or below. A tapering width 9 represents the width of a side wall tapered portion of the mark 7a, 7b having a taper angle. A tapered portion is generated by trench formation using plasma etching.

When two wafers are bonded, an overlay inspection using infrared rays, for example, is performed to detect the marks 7a, 7b, as explained later. In the overlay inspection, an overlay error in wafers or the chips CHa, CHb is measured or determined. For example, whether the relative position of the pattern Pa on an upper layer to the pattern Pb on a lower layer matches a reference position is confirmed. As a result, the relative positions of two wafers can be adjusted. However, in a case where the height difference 8 is large, focusing is difficult in some cases. For example, when an upper-layer mark (e.g. mark 7a) is focused, focusing on a lower-layer mark (e.g. mark 7b) is cancelled so that defocusing occurs. In this case, the mark 7b in FIG. 2 blurs. This deteriorates the detection accuracy of the marks 7a, 7b. In a case where the tapering width 9 is large, the edges of the marks 7a, 7b blurs. For example, when the mark 7b is detected from the lower layer, the edges of the mark 7b blur due to the tapered portions. Accordingly, the detection accuracy of the marks 7a, 7b is deteriorated. Therefore, due to the height difference 8 and the tapering width 9, the detection accuracy of the marks 7a, 7b is deteriorated so that the alignment accuracy of the chips CHa, CHb (wafers) may be deteriorated.

Therefore, the thicknesses of the marks 7a, 7b are reduced so that the height difference 8 can be reduced. Accordingly, the marks 7a, 7b are inhibited from becoming defocused during the overlay inspection so that the detection accuracy of the marks 7a, 7b can be improved. As a result of this, the alignment accuracy of the chips CHa, CHb can be improved. In addition, the thicknesses of the marks 7a, 7b are reduced so that the tapering width 9 can be reduced. Accordingly, the edges of the marks 7a, 7b are inhibited from blurring during the overlay inspection so that the detection accuracy of the marks 7a, 7b can be improved. As a result of this, the alignment accuracy of the chips CHa, CHb can be improved.

From the viewpoint of the detection accuracy, the thinner thickness of the mark 7b is preferable. However, when the mark 7b is excessively thin, detection of the mark 7b may be difficult during the overlay inspection. In a case where the mark 7b is detected with infrared rays, the thickness of the mark 7b is preferably equal to or larger than approximately 40 nm, for example.

Next, a manufacturing method of the semiconductor device will be explained.

Each of FIGS. 4 to 12 is a cross-sectional view of an example of a manufacturing method of the semiconductor device according to the first embodiment. The left side of each of FIGS. 4 to 12 and the right side of each of FIGS. 4 to 12 are cross-sectional views in different positions of the same wafer. The height (vertical) direction in the right side of each of FIGS. 4 to 12 is the same as that in the left side of each of FIGS. 4 to 12.

Figure 4:
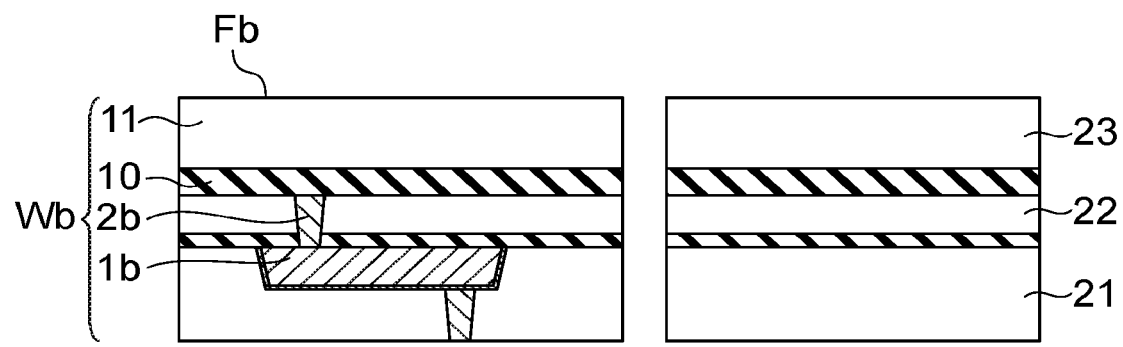
FIG. 4 is a cross-sectional view of an example of a manufacturing method of the semiconductor device according to the first embodiment.

First, as illustrated in FIG. 4, the wire 1b and the contact via 2b which is connected to the wire 1b are formed on a semiconductor substrate (not illustrated) which is a wafer Wb. Next, the stopper film 10 which is approximately 100 nm, for example, is formed on the contact via 2b. For example, a silicon nitride film ($Si_3N_4$) is used for the stopper film 10. The stopper film 10 serves not only as a barrier film against the wire but also as a stopper film for dry etching. Next, an interlayer insulating film 11 which is approximately 550 nm, for example, is formed on the stopper film 10. For example, a silicon oxide film ($SiO_2$) is used as the interlayer insulating film 11. The interlayer insulating film 11 is identical to the insulating film 23 illustrated in FIG. 1.

Figure 5:
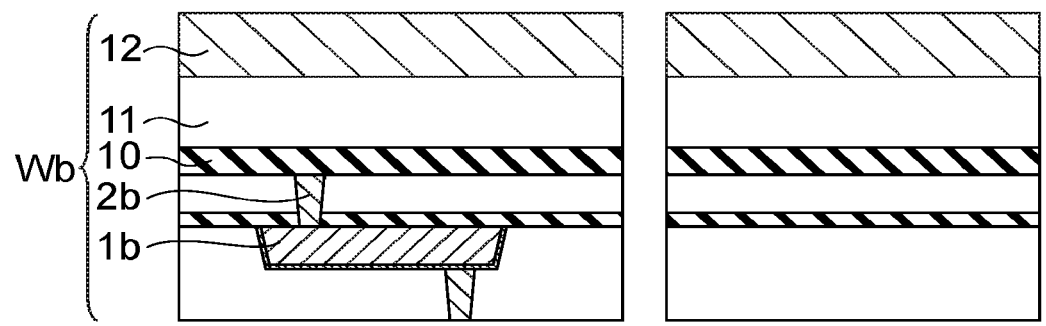
FIG. 5 is a cross-sectional view of the example of the manufacturing method of the semiconductor device after FIG. 4.

Next, a resist 12 is formed on the interlayer insulating film 11, as illustrated in FIG. 5.

Figure 6:
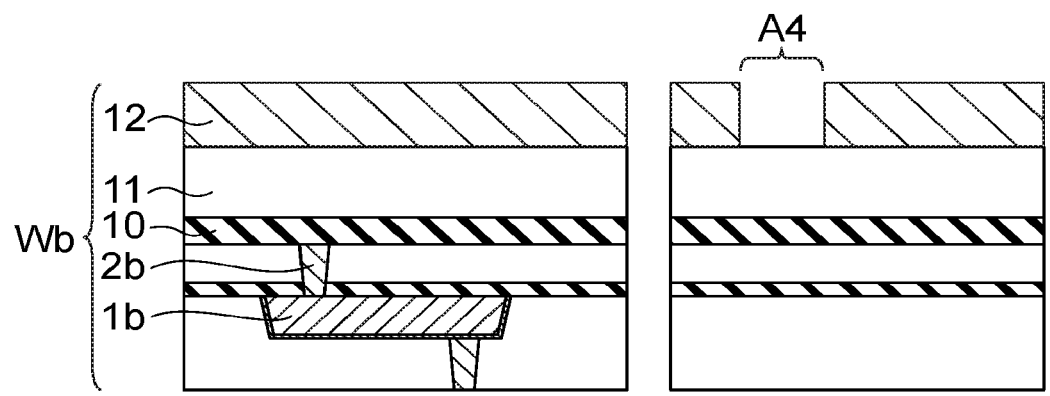
FIG. 6 is a cross-sectional view of the example of the manufacturing method of the semiconductor device after FIG. 5.

Next, the resist 12 in the mark region A4 is removed by a lithography process, as illustrated in FIG. 6.

Figure 7:
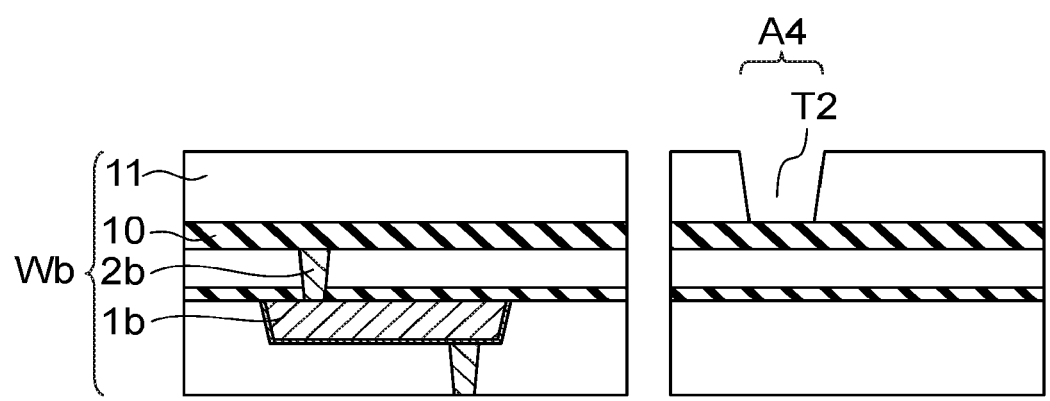
FIG. 7 is a cross-sectional view of the example of the manufacturing method of the semiconductor device after FIG. 6.

Next, the interlayer insulating film 11 is removed by a dry etching process until the stopper film 10 is exposed, as illustrated in FIG. 7. Accordingly, a trench T2 is formed.

Figure 8:
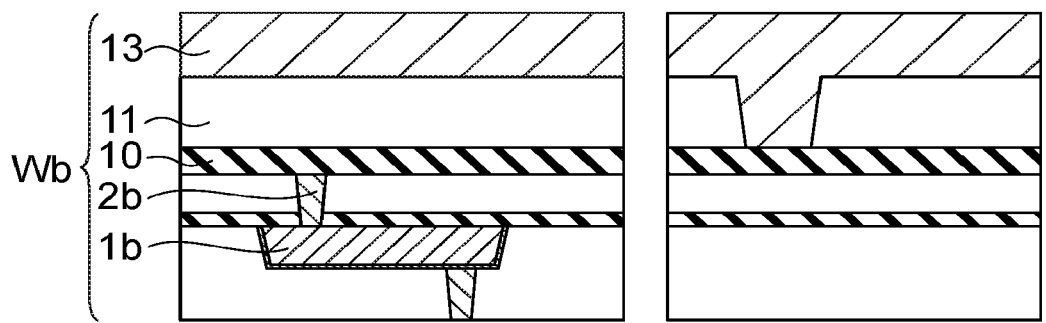
FIG. 8 is a cross-sectional view of the example of the manufacturing method of the semiconductor device after FIG. 7.

Next, a resist 13 is formed, as illustrated in FIG. 8.

Figure 9:
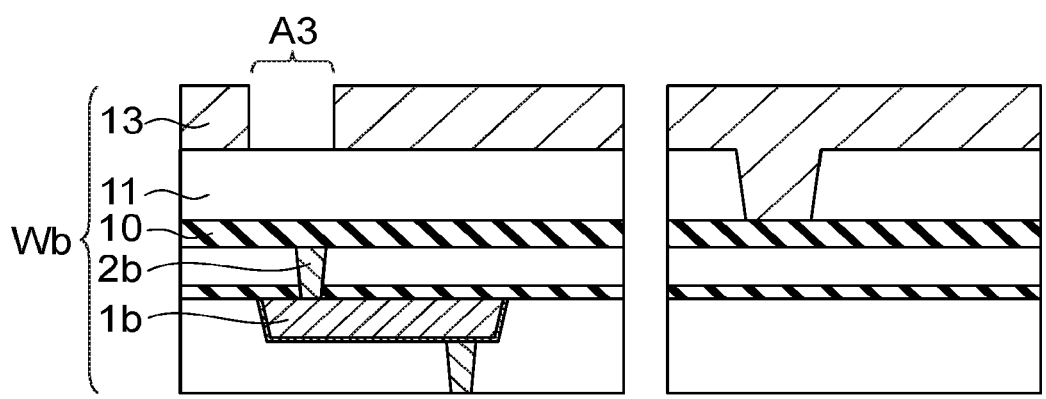
FIG. 9 is a cross-sectional view of the example of the manufacturing method of the semiconductor device after FIG. 8.

Next, the resist 13 in the connection pad region A3 is removed by a lithography process, as illustrated in FIG. 9.

Figure 10:
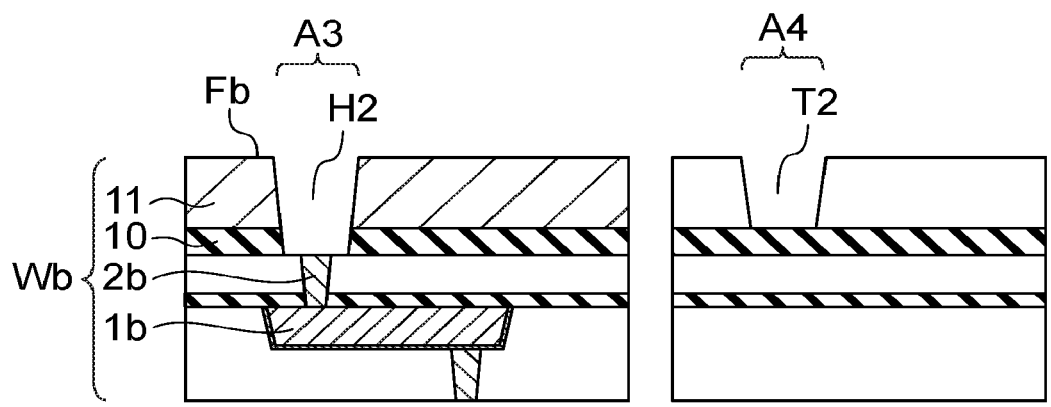
FIG. 10 is a cross-sectional view of the example of the manufacturing method of the semiconductor device after FIG. 9.

Next, the interlayer insulating film 11 and the stopper film 10 are removed by a dry etching process until the upper surface of the contact via 2b is exposed, as illustrated in FIG. 10. Accordingly, a hole H2 is formed. The trench T2 is shallower than the hole H2 by the thickness of the stopper film 10. That is, the hole H2 and the trench T2 that is shallower than the hole H2 and is of the pattern Pb corresponding to the pattern Pa are formed in the connection pad region A3 and the mark region A4 different from the connection pad region A3 on the surface Fb of the wafer Wb, respectively.

Figure 11:
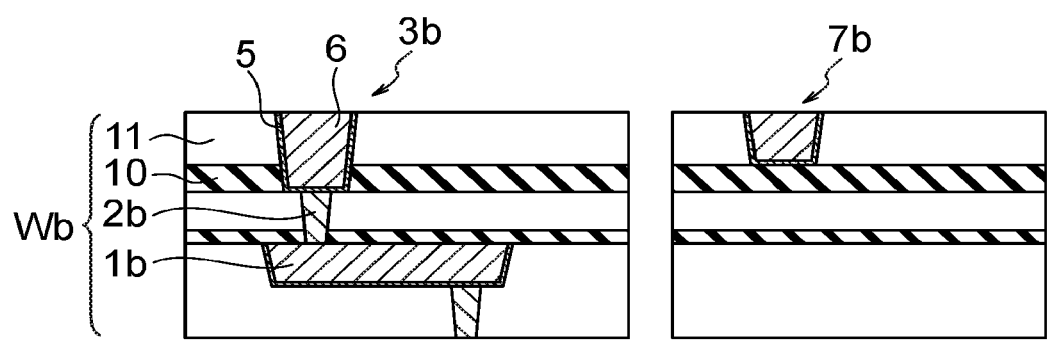
FIG. 11 is a cross-sectional view of the example of the manufacturing method of the semiconductor device after FIG. 10.

Next, as illustrated in FIG. 11, the barrier metal 5 and the wiring metal 6 are embedded in each of the hole H2 and the trench T2, whereby the connection pad 3b and the mark 7b are formed. That is, the connection pad 3b that is electrically connected to the wire 1b in the wafer Wb is formed in the hole H2, and further, the mark 7b is formed in the trench T2. Next, an excess amount of the barrier metal 5 and the wiring metal 6 is removed by a CMP (Chemical Mechanical Polishing) process. Next, the interlayer insulating film 11 is removed by approximately 100 nm, for example. Here, the connection pad 3b and the mark 7b are formed such that, for example, the thickness of the connection pad 3b and the thickness of the mark 7b are approximately 500 nm and approximately 400 nm, respectively.

Figure 12:
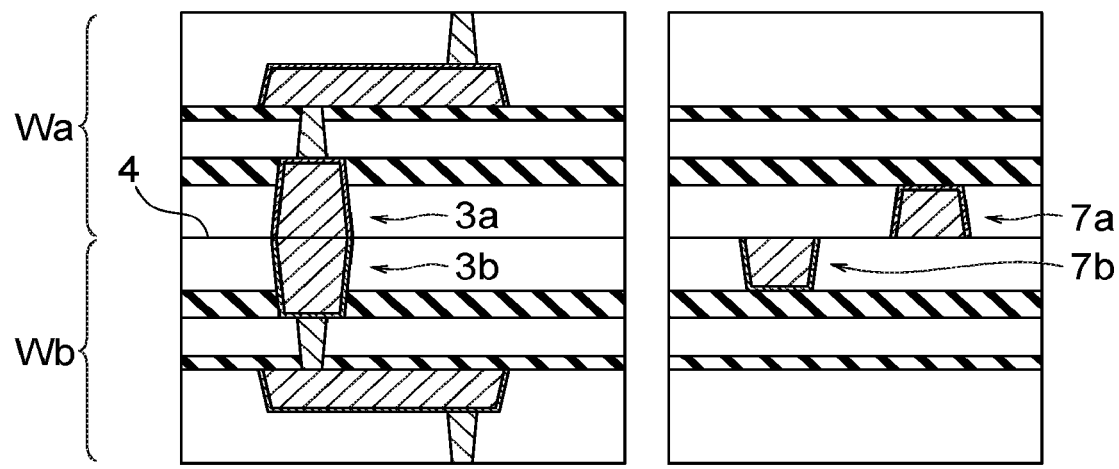
FIG. 12 is a cross-sectional view of the example of the manufacturing method of the semiconductor device after FIG. 11.

Next, as illustrated in FIG. 12, the wafer is bonded, at a bonding surface 4, to the wafer Wa having the connection pad 3a and the mark 7a formed thereon. That is, the wafer Wa and the wafer Wb are bonded together such that the surface Fa is opposed to the surface Fb. Accordingly, the connection pad 3a and the connection pad 3b are bonded together. The wafer Wa may be prepared by the same method of the wafer Wb.

Next, a detection unit is set on the lower wafer (e.g. wafer Wb) side, the position of the mark 7a and the position of the mark 7b are detected with infrared rays, whereby an overlay inspection is performed on the wafers Wa, Wb.

In the overlay inspection that is performed after bonding, transmission light may be used or reflection light may be used, for example. In a case where transmission light is used, a light source thereof and the detection unit are disposed on the wafer Wa side and the wafer Wb side, respectively. In a case where reflection light is used, a light source thereof and the detection unit are disposed on the wafer Wb side. In either case, the detection unit is disposed on the wafer Wb side having the mark 7b which is thinner than the connection pad 3b. In the embodiment illustrated in FIG. 12, the detection unit may be disposed on the wafer Wa side since the mark 7a is also thinner than the connection pad 3a. That is, the positions of the marks 7a, 7b may be detected from the wafer Wa side.

As explained so far, according to the first embodiment, the connection pad 3b is disposed so as to be exposed from the connection pad region A3 on the surface Fb, and is electrically connected to the wire 1b and the connection pad 3a. The mark 7b is provided by the pattern Pb corresponding to the pattern Pa, is disposed so as to be exposed from the mark region A4 different from the connection pad region A3, and has a thinner thickness from the surface Fb than the connection pad 3b. Accordingly, the height difference 8 and the tapering width 9 can be suppressed, defocusing and edge blurring during the overlay inspection can be suppressed, and the measurement accuracy of the positions of the marks 7a, 7b can be improved. As a result of this, the alignment accuracy of the wafers Wa, Wb can be improved.

The contact vias 2a, 2b illustrated in FIG. 1 are single damascene wires. The contact vias 2a, 2b are not limited to them, and may be dual damascene wires.

Further, the contact vias 2a, 2b does not need to be provided. In this case, the connection pads 3a, 3b are directly connected to the wires 1a, 1b, respectively.

First Modification

Figure 13:
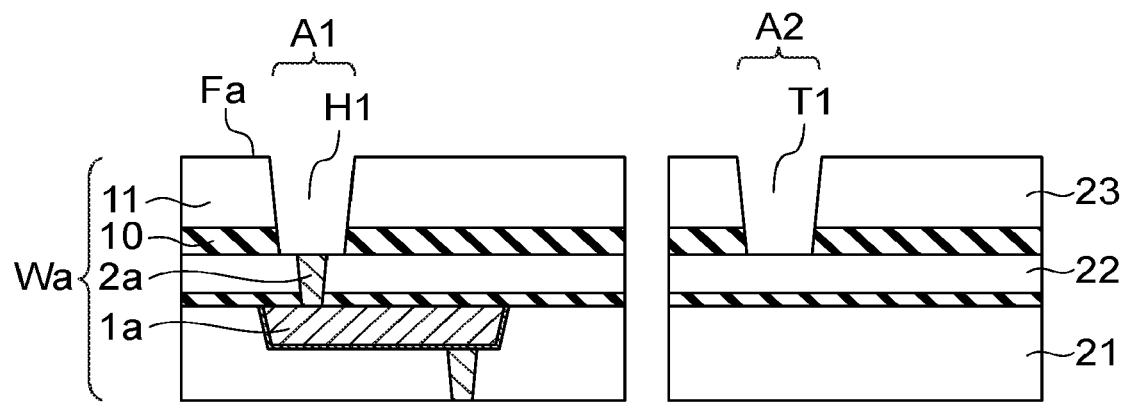
FIG. 13 is a cross-sectional view of an example of a manufacturing method of a semiconductor device according to a first modification.

FIG. 13 is a cross-sectional view of an example of a manufacturing method of a semiconductor device according to a first modification. The first modification is different from the first embodiment in that, in the first modification, the thickness of the mark 7a is substantially equal to the thickness of the connection pad 3a. That is, the thickness of the mark 7a does not need to be thinner than the thickness of the connection pad 3a.

Processes the same as those in FIGS. 4 and 5 are performed on the wafer Wa.

After FIG. 5, the resist 12 in the connection pad region A1 and the mark region A2 are removed by a lithography process. Next, the interlayer insulating film 11 and the stopper film 10 are removed by a dry etching process until the upper surface of the contact via 2a in the connection pad region A1 and the insulating film 22 in the mark region A2 are exposed. Accordingly, a hole H1 and a trench T1 are formed. That is, the hole H1 and the trench T1 of the pattern Pa are formed in the connection pad region A1 and the mark region A2 different from the connection pad region A1, respectively, on the surface Fa of the wafer Wa. Since the hole H1 and the trench T1 are simultaneously formed, the depth of the hole H1 is substantially equal to the depth of the trench T1.

Thereafter, as illustrated in FIG. 11, the barrier metal 5 and the wiring metal 6 are embedded in the hole H1 and the trench T1 so that the connection pad 3b and the mark 7b are formed. That is, the connection pad 3a that is electrically connected to the wire 1a in the wafer Wa is formed in the hole H1, and further, the mark 7a is formed in the trench T1.

Either of the wafer Wa and the wafer Wb may be manufactured first, or both the wafers may be parallelly manufactured.

Since the detection unit is disposed on the wafer Wb side, the thickness of the mark 7a does not affect the overlay inspection. Therefore, in the first modification, the number of processes can be made less than that in the first embodiment. Further, in at least one of the chips CHa, CHb in the first modification, it is sufficient that the mark 7a, 7b is thinner than the connection pad 3a, 3b. That is, in a case where the position of the detection unit during the overlay inspection is decided, the thickness of the mark 7a/7b nearer to the detection unit is set to be thinner than the thickness of the connection pad 3a/3b.

In FIG. 1, the chip CHa is an upper layer, and the chip CHb is a lower layer. However, the positions thereof may be inverted. That is, the chip CHa may be a lower layer, and the chip CHb may be an upper layer.

With the semiconductor device according to the first modification, the same effect as that of the first embodiment can be provided.

Second Embodiment

Each of FIGS. 14 to 17 is a cross-sectional view of an example of a manufacturing method of a semiconductor device according to a second embodiment. The second embodiment is different from the first embodiment in that, in the second embodiment, the hole H2 and the trench T2 are formed by the same process.

Figure 14:
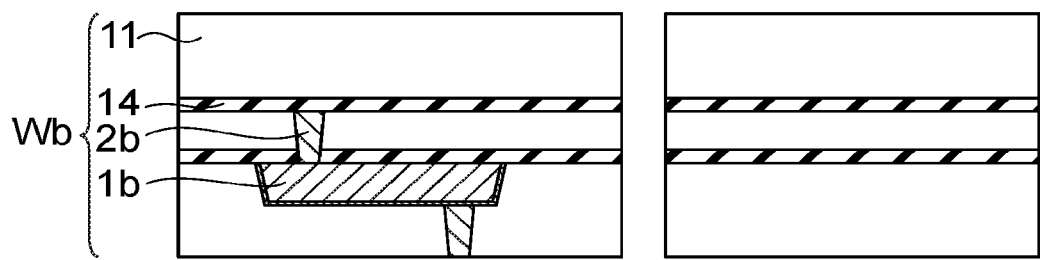
FIG. 14 is a cross-sectional view of an example of a manufacturing method of a semiconductor device according to a second embodiment.

First, the wire 1b and the contact via 2b that is connected to the wire 1b are formed on the semiconductor substrate which is the wafer Wb, as illustrated in FIG. 14. Next, the barrier film 14 which is approximately 50 nm, for example, is formed on the contact via 2b. For example, a silicon nitride film ($Si_3N_4$) is disposed as the barrier film 14. Next, the interlayer insulating film 11 which is approximately 550 nm, for example, is formed.

Figure 15:
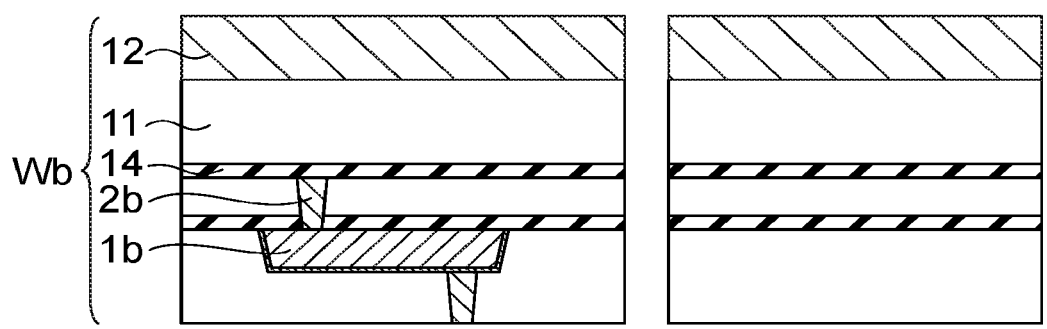
FIG. 15 is a cross-sectional view of the example of the manufacturing method of the semiconductor device after FIG. 14.

Next, the resist 12 is formed on the interlayer insulating film 11, as illustrated in FIG. 15.

Figure 16:
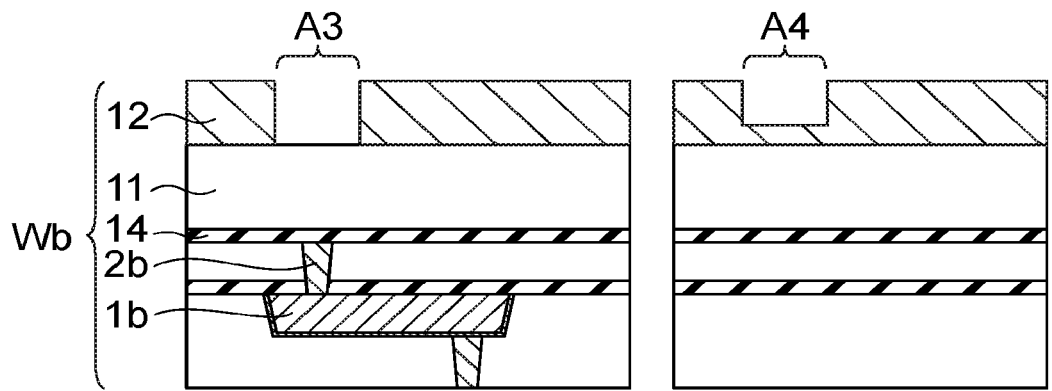
FIG. 16 is a cross-sectional view of the example of the manufacturing method of the semiconductor device after FIG. 15.

Next, by a lithography process using a gray scale lithography technology, the resist 12 in the connection pad region A3 is removed, and, at the same time, the resist 12 in the mark region A4 is partially removed, as illustrated in FIG. 16. That is, before the hole H2 and the trench T2 are formed, a mask (resist 12) having a thickness that is thinner in the connection pad region A3 than in the mark region A4, is formed on the surface Fb. More specifically, before the hole H2 and the trench T2 are formed, the resist 12 is formed by a lithography process using a photomask in which a transmittance corresponding to the connection pad region A3 is greater than a transmittance corresponding to the mark region A4.

Figure 17:
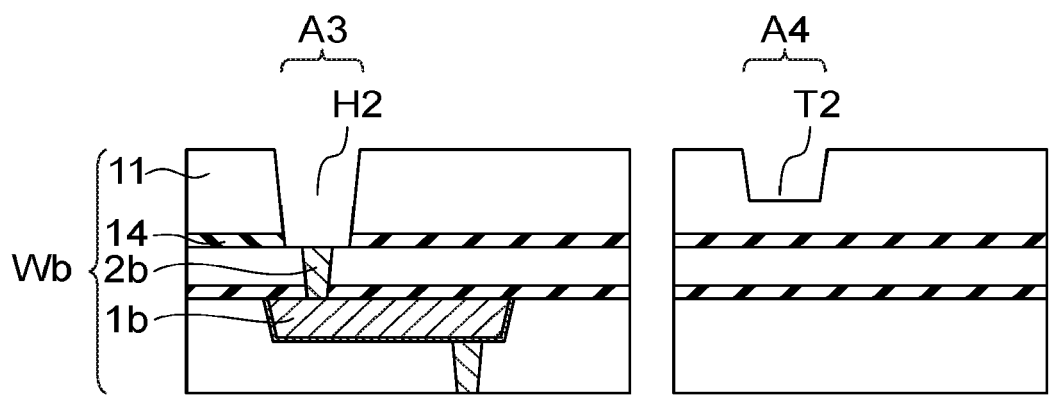
FIG. 17 is a cross-sectional view of the example of the manufacturing method of the semiconductor device after FIG. 16.

Next, the hole H2 is formed by removing the interlayer insulating film 11 and the barrier film 14 by a dry etching process until the upper surface of the contact via 2b is exposed in the connection pad region A3, and, at the same time, the trench T2 that is shallower than the hole H2 is formed by partially removing the interlayer insulating film 11 in the mark region A4, as illustrated in FIG. 17. That is, both the hole H2 and the trench T2 are formed (simultaneously).

The following processes are identical to those in the first embodiment. The connection pad 3b and the mark 7b are formed such that the final thickness of the connection pad 3b is approximately 500 nm, for example, and the final thickness of the mark 7b is approximately 300 nm, for example.

In the second embodiment, the connection pad 3b and the mark 7b are formed by the same lithography process. Accordingly, a positional deviation between the connection pad 3b and the mark 7b can be prevented. Further, the accuracy of the overlay inspection can be higher than that in the first embodiment. Moreover, the connection pad 3b and the mark 7b can be formed by the single lithography process and the single dry etching process, whereby the number of processes can be less than that in the first embodiment.

With the semiconductor device according to the second embodiment, the same effect as that of the first embodiment can be provided.

Second Modification

A semiconductor device according to a second modification is different from that of the second embodiment in that the second modification uses a nano-imprinting technology during a lithography process.

In FIG. 16, with use of the nano-imprinting technology, the resist 12 in the connection pad region A3 is removed, and, at the same time, the resist 12 in the mark region A4 is partially removed. That is, before the hole H2 and the trench T2 are formed, the resist 12 is formed by a lithography process using a template that has a plurality of projections. In the template, a projection corresponding to the connection pad region A3 is higher than a projection corresponding to the mark region A4.

With the semiconductor device according to the second modification, the same effect as that of the second embodiment can be provided.

Third Embodiment

Figure 18:
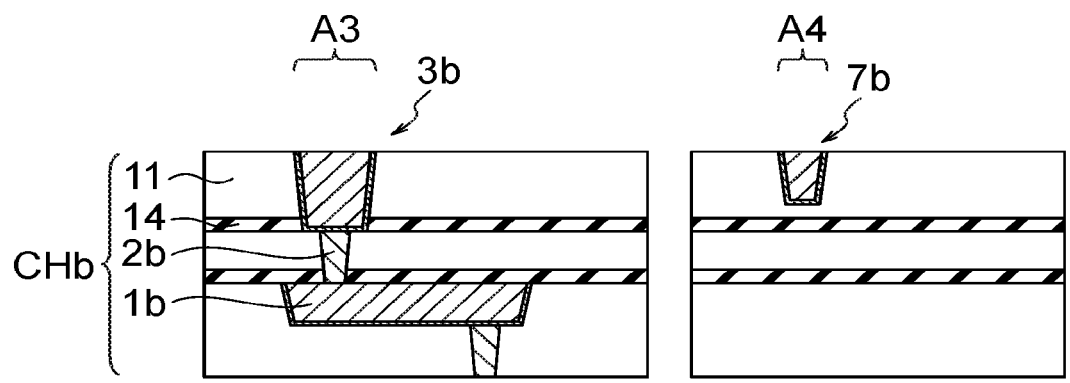
FIG. 18 is a cross-sectional view of a configuration of a semiconductor device according to a third embodiment.

FIG. 18 is a cross sectional view of a configuration of a semiconductor device according to a third embodiment. The semiconductor device according to the third embodiment is different from that according to the first embodiment in that the third embodiment forms the mark 7b having a thinner thickness than the connection pad 3b by using a loading effect. In FIG. 18, the chip CHb is illustrated while the chip CHa is omitted.

The width of the mark 7b is narrower than the width of the connection pad 3b. That is, the mark 7b has a thinner thickness and a narrower width than the connection pad 3b. The width of the mark 7b is equal to or smaller than a half of the width of the connection pad 3b, for example. Further, the width of the mark 7b represents a shorter diameter of the mark 7b illustrated in FIG. 2, for example. The shorter diameter refers to a shortest width in the pattern Pb which is a layout of the marks 7b, for example. In the embodiment illustrated in FIG. 2, the width of the mark 7b corresponds to the length of a shorter side of the substantially rectangular shape of the mark 7b. Therefore, it is preferable that the pattern Pb has a shape having a narrow width. In addition, the pattern Pb is recognized from the entirety of the mark 7b during the overlay inspection. Therefore, it is preferable that the pattern Pb is formed such that the entire thickness of the mark 7b is reduced by a loading effect.

The rest of the configuration of the semiconductor device according to the third embodiment is identical to those of the semiconductor device according to the first embodiment. Therefore, a detailed explanation thereof will be omitted.

Next, a manufacturing method of the semiconductor device will be explained.

Each of FIGS. 19 to 22 is a cross-sectional view of an example of a manufacturing method of the semiconductor device according to the third embodiment.

Figure 19:
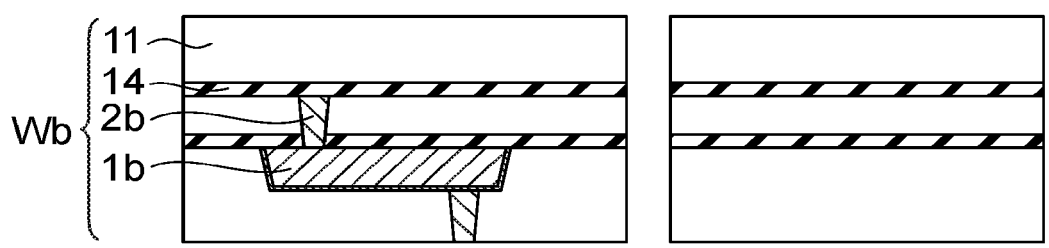
FIG. 19 is a cross-sectional view of an example of a manufacturing method of the semiconductor device according to the third embodiment.

First, the wire 1b and the contact via 2b that is connected to the wire 1b are formed on a semiconductor substrate which is the wafer Wb, as illustrated in FIG. 19. Next, the barrier film 14 which is approximately 30 nm, for example, is formed on the contact via 2b. Next, the interlayer insulating film 11 which is approximately 600 nm, for example, is formed.

Figure 20:
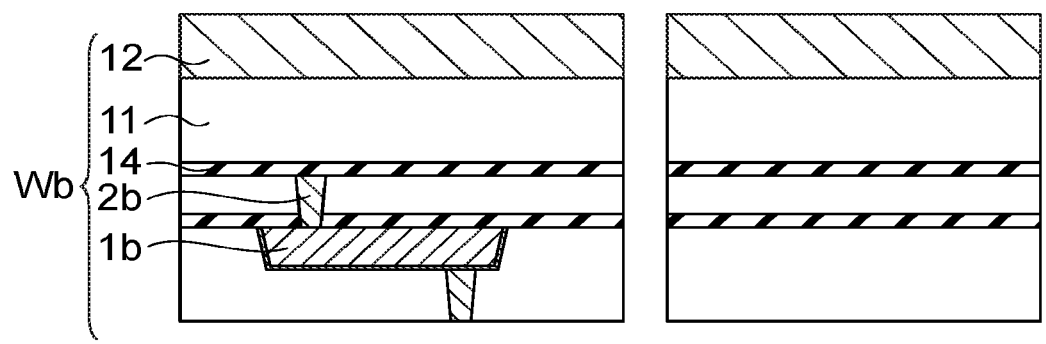
FIG. 20 is a cross-sectional view of the example of the manufacturing method of the semiconductor device after FIG. 19.

Next, the resist 12 is formed on the interlayer insulating film 11, as illustrated in FIG. 20.

Figure 21:
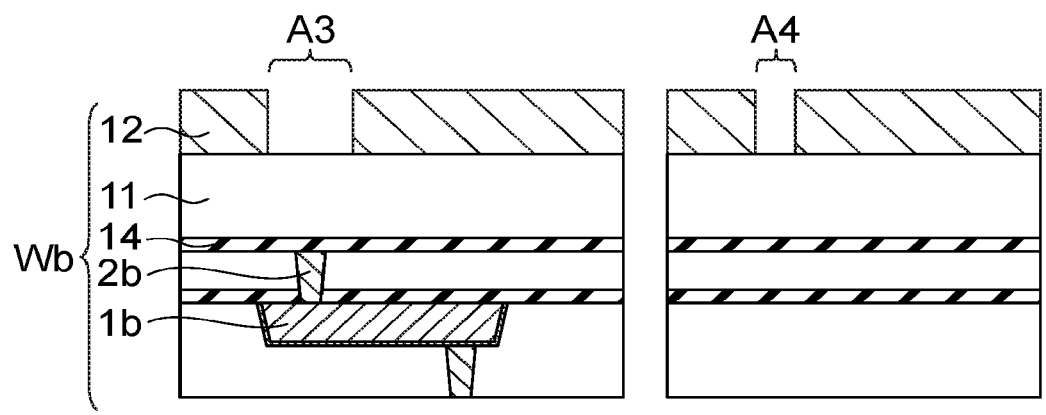
FIG. 21 is a cross-sectional view of the example of the manufacturing method of the semiconductor device after FIG. 20.

Next, the resist 12 in the connection pad region A3 and the mark region A4 is removed by a lithography process, as illustrated in FIG. 21. Here, the horizontal size of the mark region A4 is set to be smaller than the horizontal size of the connection pad region A3. In the third embodiment, the connection pad region A3 is formed into a substantially square shape having a width of approximately 2 μm, and the mark region A4 is formed so as to have a width of approximately 0.5 μm, for example.

Figure 22:
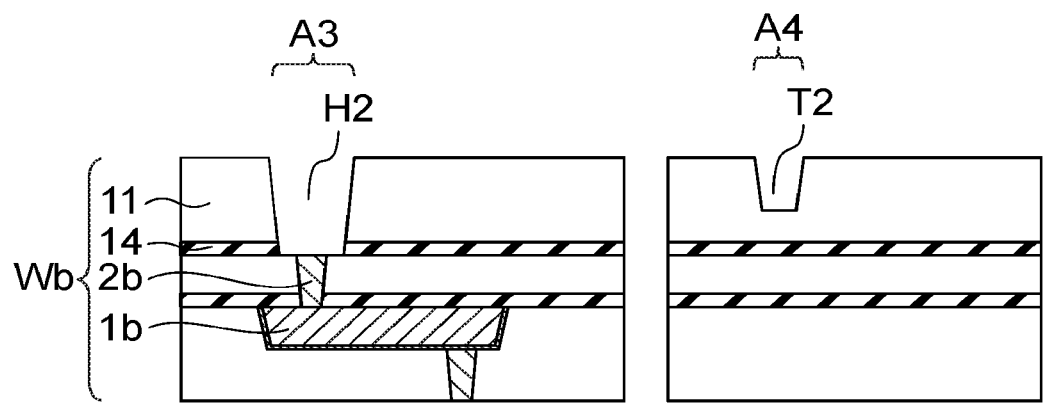
FIG. 22 is a cross-sectional view of the example of the manufacturing method of the semiconductor device after FIG. 21.

Next, as illustrated in FIG. 22, the interlayer insulating film 11 and the barrier film 14 are removed by a dry etching process until the upper surface of the contact via 2b is exposed in the connection pad region A3 so that the hole H2 is formed, and, at the same time, the interlayer insulating film 11 is partially removed from the mark region A4 with use of a loading effect so that the trench T2 that is shallower than the hole H2 is formed. That is, the hole H2 is formed, and further (at the same time), the trench T2 having a narrower width than the hole H2 is formed so that the trench T2 that is shallower than the hole H2 is formed.

The following steps are identical to those in the first embodiment. The connection pad 3b and the mark 7b are formed such that the final thickness of the connection pad 3b is approximately 500 nm, for example, and the thickness of the mark 7b is approximately 300 nm, for example.

In the third embodiment, the horizontal size of the mark 7b is set to be smaller than the horizontal size of the connection pad 3b, and a loading effect is used in the dry etching process. Accordingly, the mark 7b having a thinner thickness than the connection pad 3b can be formed by the single lithography process and the single dry etching process, the accuracy of the overlay inspection can be improved, and further, the number of processes can be reduced. In addition, in a case where a loading effect is used, the mark 7b can be more easily formed, compared to the gray scale lithography or the nanoimprint lithography, which have been explained in the second embodiment and the second modification, respectively.

With the semiconductor device according to the third embodiment, the same effect as that of the first embodiment can be provided.

Fourth Embodiment

Figure 23:
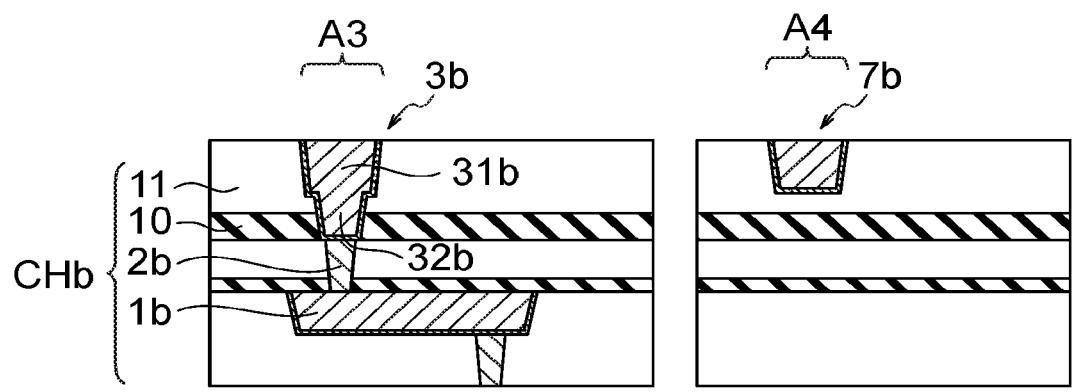
FIG. 23 is a cross-sectional view of a configuration of a semiconductor device according to a fourth embodiment.

FIG. 23 is a cross-sectional view of a configuration of a semiconductor device according to a fourth embodiment. The semiconductor device according to the fourth embodiment is different from that of the first embodiment in that two-stage processing is performed on the connection pad 3b in the fourth embodiment. In FIG. 23, the chip CHb is illustrated while the chip CHa is omitted.

The connection pad 3b includes a pad portion 31b and a pad portion 32b.

The pad portion 31b is disposed so as to be exposed from the connection pad region A3. The thickness, of the pad portion 31b, from the surface Fb is equal to the thickness, of the mark 7b, from the surface Fb.

The pad portion 32b is disposed below the pad portion 31b, and has a width different from that of the pad portion 31b. More specifically, the width (width W1) of the pad portion 32b is narrower than the width (width W2) of the pad portion 31b. Widths of the pad portion 31b and the pad portion 32b include both a shorter diameter and a longer diameter. For example, the pad portion 32b having a substantially square shape and having a smaller area than the pad portion 31b is disposed below the pad portion 31b having a substantially square shape. The pad portion 32b is formed by the same embedding process for the pad portion 31b. Therefore, the material characteristics, etc. of the pad portion 32b are identical to those of the pad portion 31b.

The rest of the configuration of the semiconductor device according to the fourth embodiment is identical to those of the semiconductor device according to the first embodiment. Therefore, a detailed explanation thereof will be omitted.

Next, a manufacturing method of the semiconductor device will be explained.

Each of FIGS. 24 to 30 is a cross-sectional view of an example of a manufacturing method of the semiconductor device according to the fourth embodiment.

Figure 24:
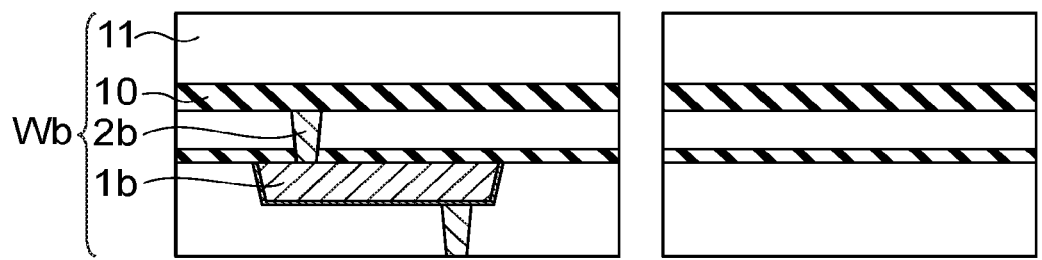
FIG. 24 is a cross-sectional view of an example of a manufacturing method of the semiconductor device according to the fourth embodiment.

First, the wire 1b and the contact via 2b that is connected to the wire 1b are formed on a semiconductor substrate which is the wafer Wb, as illustrated in FIG. 24. Next, the stopper film 10 which is approximately 100 nm, for example, is formed on the contact via 2b. Next, the interlayer insulating film 11 which is approximately 550 nm, for example, is formed.

Figure 25:
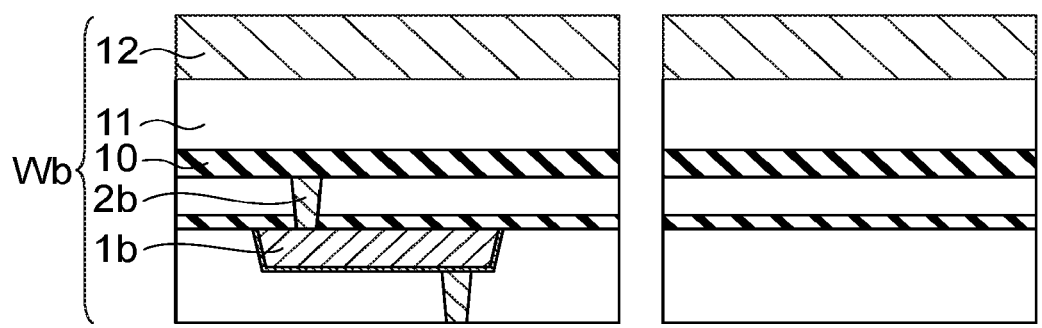
FIG. 25 is a cross-sectional view of the example of the manufacturing method of the semiconductor device after FIG. 24.

Next, the resist 12 is formed on the interlayer insulating film 11, as illustrated in FIG. 25.

Figure 26:
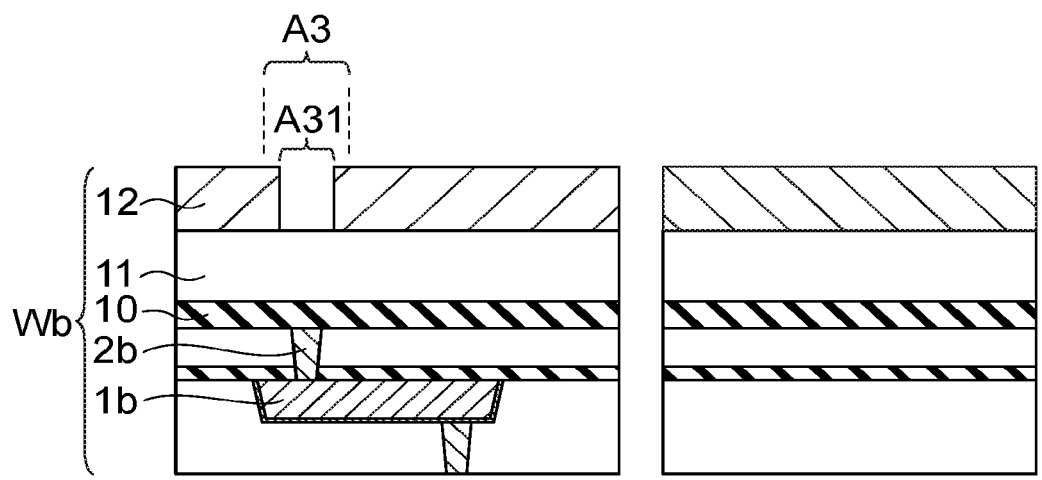
FIG. 26 is a cross-sectional view of the example of the manufacturing method of the semiconductor device after FIG. 25.

Next, the resist 12 is removed from an inner region A31 that is narrower than the connection pad region A3, by a lithography process, as illustrated in FIG. 26.

Figure 27:
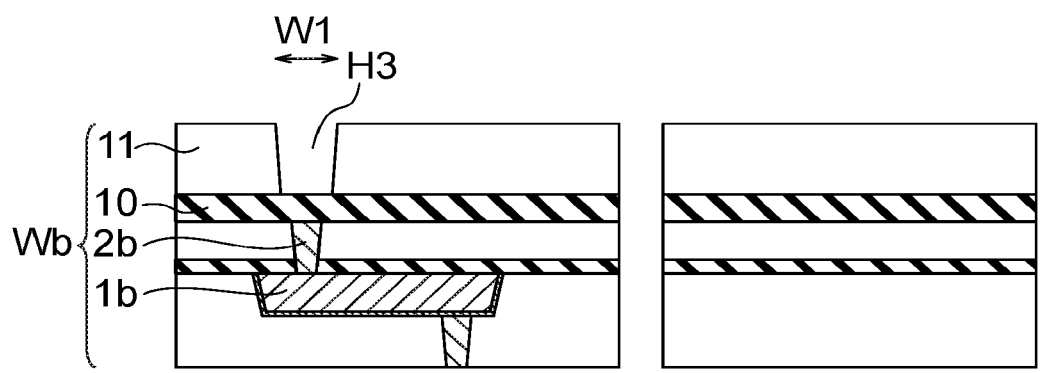
FIG. 27 is a cross-sectional view of the example of the manufacturing method of the semiconductor device after FIG. 26.

Next, the interlayer insulating film 11 is removed by a dry etching process until the stopper film 10 is exposed, as illustrated in FIG. 27. That is, a hole H3 having the width W1 is formed in the inner region A31 in the connection pad region A3.

Figure 28:
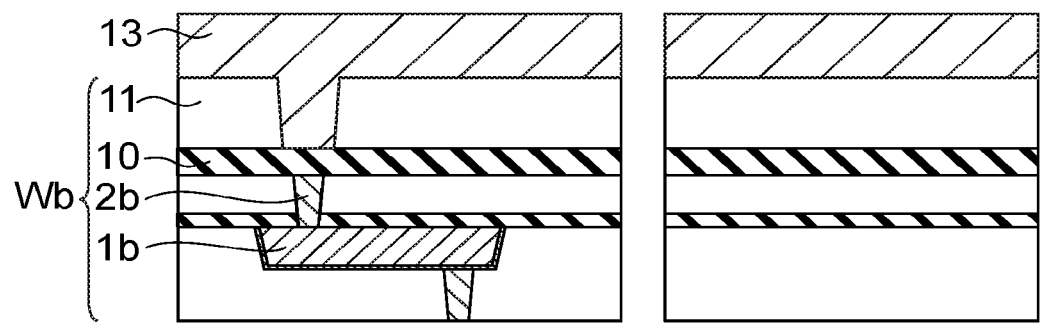
FIG. 28 is a cross-sectional view of the example of the manufacturing method of the semiconductor device after FIG. 27.

Next, the resist 13 is formed, as illustrated in FIG. 28.

Figure 29:
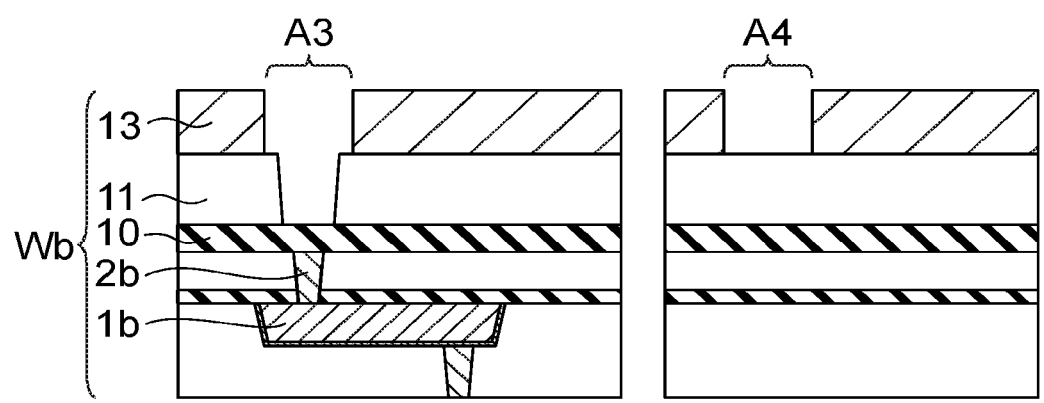
FIG. 29 is a cross-sectional view of the example of the manufacturing method of the semiconductor device after FIG. 28.

Next, the resist 13 is removed from the connection pad region A3 and the mark region A4 by a lithography process, as illustrated in FIG. 29.

Figure 30:
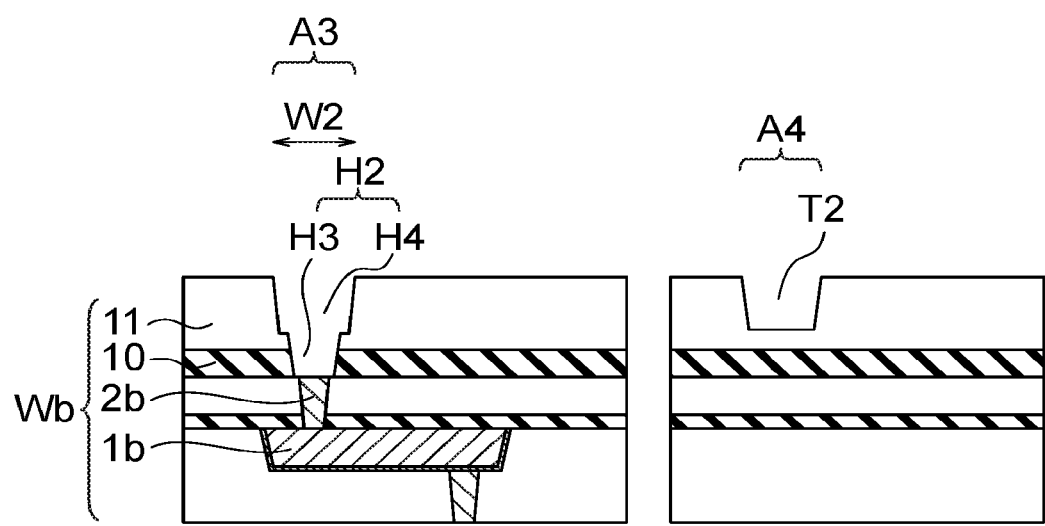
FIG. 30 is a cross-sectional view of the example of the manufacturing method of the semiconductor device after FIG. 29.

Next, as illustrated in FIG. 30, the interlayer insulating film 11 and the stopper film 10 are removed from the inner region A31 by a dry etching process until the upper surface of the contact via 2b is exposed so that the hole H2 is formed. Accordingly, the hole H2 having a shallow outer circumferential region (connection pad region A3) and the narrow inner region A31, and the trench T2 having the same depth as that of the outer circumferential region of the hole H2, are formed. That is, a hole H4 having the width W2 different from the width W1 is formed in the connection pad region A3, whereby the hole H2 is formed, and further (at the same time), the trench T2 is formed.

The following steps are identical to those in the first embodiment. The connection pad 3b and the mark 7b are formed such that the final thickness of the connection pad 3b is approximately 500 nm, for example, and the thickness of the mark 7b is approximately 300 nm, for example.

In the fourth embodiment, the connection pad 3b is formed by two stages, and further, the upper portion (pad portion 31b) of the connection pad 3b and the mark 7b are formed by the same lithography process. Accordingly, the mark 7b having a thinner thickness than the connection pad 3b can be formed. Moreover, the same lithography process is performed to decide the position of the pad portion 31b and the position of the mark 7b which constitute an exposed surface for bonding. Therefore, the accuracy of the overlay inspection can be higher than that in the first embodiment.

The semiconductor device according to the fourth embodiment can provide the same effect as the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a first chip; and
    a second chip having a second surface on which the second chip is bonded to the first chip, the second surface being opposed to a first surface of the first chip, wherein
    the first chip includes
        a first substrate,
        a first wire that is disposed on the first substrate,
        a first pad that is disposed so as to be exposed from a first region on the first surface and that is electrically connected to the first wire, and
        a first mark that is provided by a first pattern and that is disposed so as to be exposed from a second region which is different from the first region, and
    the second chip includes
        a second substrate,
        a second wire that is disposed on the second substrate,
        a second pad that is disposed so as to be exposed from a third region on the second surface and that is electrically connected to the second wire and the first pad, and
        a second mark that is provided by a second pattern corresponding to the first pattern, that is disposed so as to be exposed from a fourth region which is different from the third region, and that has a thinner thickness from the second surface than the second pad.

2. The semiconductor device according to claim 1, wherein
    a width of the second mark is narrower than a width of the second pad.

3. The semiconductor device according to claim 1, wherein
    the second pad includes
        a first pad portion that is disposed so as to be exposed from the third region, and that has a thickness from the second surface equal to a thickness, of the second mark, from the second surface, and
        a second pad portion that is disposed below the first pad portion, and that is different in a width from the first pad portion.

4. A manufacturing method of a semiconductor device, the method comprising:
    forming a first hole and a first trench of a first pattern, in a first region and a second region different from the first region on a first surface of a first wafer;

forming, in the first hole, a first pad that is electrically connected to a first wire in the first wafer, and further, forming a first mark in the first trench;

forming, in a third region and a fourth region different from the third region on a second surface of a second wafer, a second hole and a second trench of a second pattern corresponding to the first pattern, the second trench being shallower from the second surface than the second hole;

forming, in the second hole, a second pad that is electrically connected to a second wire in the second wafer, and further, forming a second mark in the second trench;

bonding the first wafer and the second wafer together such that the first surface is opposed to the second surface; and detecting a positional deviation between the first pad and the second pad in accordance with the first mark and the second mark.

5. The manufacturing method of a semiconductor device according to claim 4, further comprising:

detecting a positional deviation between the first pad and the second pad by detecting a position of the first mark and a position of the second mark from the second wafer side.

6. The manufacturing method of a semiconductor device according to claim 5, further comprising:

forming, on the first surface, a mask having a thickness that is thinner in the third region than in the fourth region, prior to forming the second hole and the second trench; and forming the second hole, and further, forming the second trench.

7. The manufacturing method of a semiconductor device according to claim 6, comprising forming the mask by lithography using a photomask in which a transmittance corresponding to the third region is higher than a transmittance corresponding to the fourth region, prior to forming the second hole and the second trench.

8. The manufacturing method of a semiconductor device according to claim 6, comprising forming the mask by lithography using a template that has a plurality of projections such that a projection corresponding to the third region is higher than a projection corresponding to the fourth region, prior to forming the second hole and the second trench.

9. The manufacturing method of a semiconductor device according to claim 5, comprising forming the second hole, and further, forming the second trench that is shallower than the second hole by forming the second trench having a narrower width than the second hole.

10. The manufacturing method of a semiconductor device according to claim 5, comprising:

forming, in the third region, a third hole having a first width; and forming the second hole by forming, in the third region, a fourth hole having a second width different from the first width, and further, forming the second trench.

11. The manufacturing method of a semiconductor device according to claim 4, further comprising:

forming, on the first surface, a mask having a thickness that is thinner in the third region than in the fourth region, prior to forming the second hole and the second trench; and forming the second hole, and further, forming the second trench.

12. The manufacturing method of a semiconductor device according to claim 11, comprising forming the mask by lithography using a photomask in which a transmittance corresponding to the third region is higher than a transmittance corresponding to the fourth region, prior to forming the second hole and the second trench.

13. The manufacturing method of a semiconductor device according to claim 11, comprising forming the mask by lithography using a template that has a plurality of projections such that a projection corresponding to the third region is higher than a projection corresponding to the fourth region, prior to forming the second hole and the second trench.

14. The manufacturing method of a semiconductor device according to claim 4, comprising forming the second hole, and further, forming the second trench that is shallower than the second hole by forming the second trench having a narrower width than the second hole.

15. The manufacturing method of a semiconductor device according to claim 4, comprising:

forming, in the third region, a third hole having a first width; and forming the second hole by forming, in the third region, a fourth hole having a second width different from the first width, and nuttier, forming the second trench.

* * * * *